(12) United States Patent
Maula

(10) Patent No.: US 6,218,967 B1
(45) Date of Patent: Apr. 17, 2001

(54) ARRANGEMENT FOR THE OPTICAL REMOTE CONTROL OF APPARATUS

(76) Inventor: Kyosti Veijo Olavi Maula, Siipi 6 Fin-02660, Espoo (FI)

( * ) Notice: Subject to any disclaimer, the term of this patent is extended or adjusted under 35 U.S.C. 154(b) by 0 days.

(21) Appl. No.: 09/155,694

(22) PCT Filed: Apr. 1, 1997

(86) PCT No.: PCT/FI97/00199

§ 371 Date: Sep. 30, 1998

§ 102(e) Date: Sep. 30, 1998

(87) PCT Pub. No.: WO97/37430

PCT Pub. Date: Oct. 9, 1997

(30) Foreign Application Priority Data

Apr. 1, 1996 (FI) ...................................................... 961459

(51) Int. Cl.$^7$ ................................................. G09G 5/00
(52) U.S. Cl. ................................. 341/31; 341/20; 341/22; 250/221; 250/347; 250/341.7; 345/168; 345/173
(58) Field of Search ................................ 341/20, 22, 31, 341/173, 176, 24; 345/168, 173, 158; 250/341.7, 347, 221

(56) References Cited

U.S. PATENT DOCUMENTS

| 3,769,515 | 10/1973 | Clark, Jr. | 250/341.7 |
| 4,701,747 | 10/1987 | Isherwood et al. | 341/24 |
| 5,483,261 | * | 1/1996 | Yasutake | 345/173 |
| 5,767,842 | * | 6/1998 | Korth | 345/168 |
| 5,801,681 | * | 9/1998 | Sayag | 345/157 |

FOREIGN PATENT DOCUMENTS

| 3932508 | 4/1991 | (DE) . |
| 4007971 | 9/1991 | (DE) . |
| 4408058 | 9/1995 | (DE) . |
| 440969 | 8/1985 | (SE) . |

* cited by examiner

Primary Examiner—Michael Horabik
Assistant Examiner—Albert K. Wong
(74) Attorney, Agent, or Firm—Fay, Sharpe, Fagan, Minnich & McKee, LLP

(57) ABSTRACT

An arrangement for the optical remote control of an apparatus such as a data terminal, an online bill payment terminal, movement surveillance equipment or the like, employing the palm of a hand or a finger of an operator as a control includes a light transmitter part in which there are several sources of light. The light from each of the sources of light of the light transmitter travel through a first collector member to a presumed keyboard in which a keyboard layout is arranged. Each presumed key in the keyboard layout is connected to at least one source of light in the transmitter part. The image of the source of light is visible at the location of the relevant presumed key. Also provided is a light receiver part and a second collector member through which the image of the source of light at the key in question, travels to the receiver part. A processor controls the operation of the light transmitter part. Each source of light is timed to light up in turn as part of a group and/or separately so that when the finger or palm of the hand is at the position of a presumed key, the light coming from the source of light is reflected from it through the second collector member to the receiver part. The processor recognizes the moment when the various sources of light are on, and on the basis of data relating to the moment of reception of the light arriving at the receiver, it recognizes which key is in operation.

17 Claims, 3 Drawing Sheets

ARRANGEMENT FOR THE OPTICAL REMOTE CONTROL OF APPARATUS

The object of the invention is an arrangement for the optical remote control of apparatus, such as an information terminal, on-line bill payment terminal, movement surveillance equipment, or similar, by using as the controlling device the palm of the hand or a finger or a separate, hand-held controlling device.

The object of the invention is to facilitate the optical remote control of different processor controlled apparatus, so that the said apparatus can be used through glass, for example, by touching the positions of the keys located on the outer surface of the glass. This kind of arrangement is suitable for use in the windows of various types of shops, for example, when the apparatus could contain different kinds of information about the products on sale and the raw materials and production methods used etc. An optical keyboard according to the invention is also suitable for use in diverse on-line bill payment terminals and movement monitoring equipment.

An arrangement according to the invention is characterized by the features presented in identifying part 1 of the Patent Claims.

Figure 1:
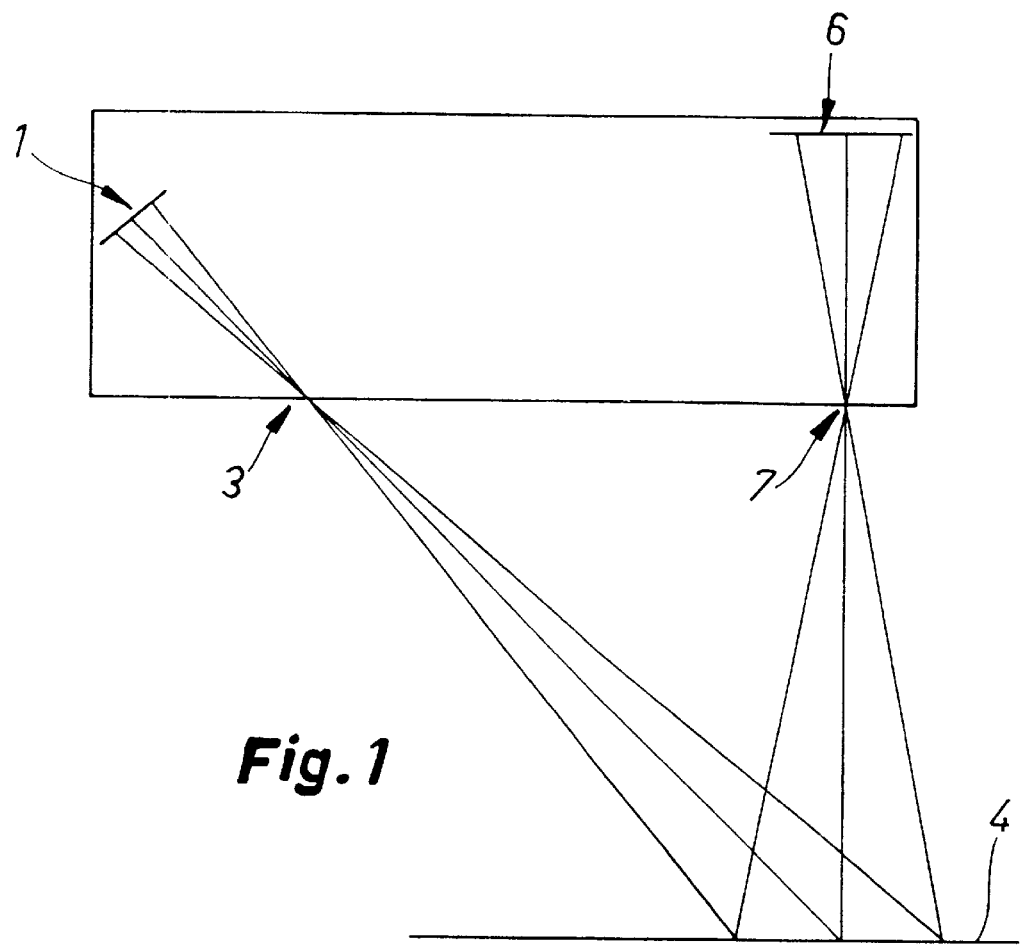
Figure 4:
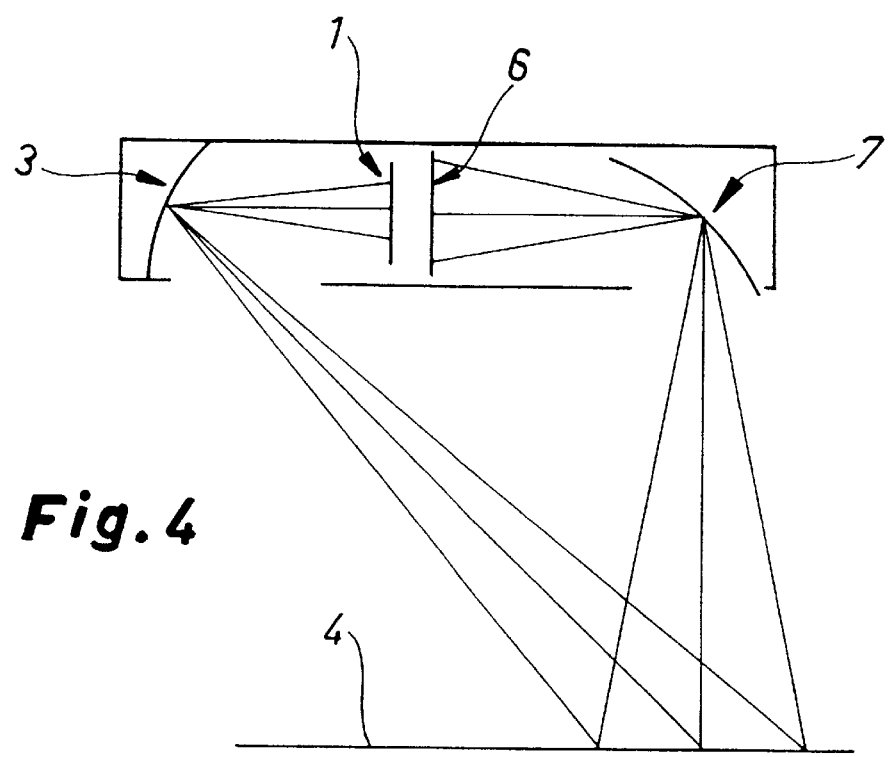
Figure 2:
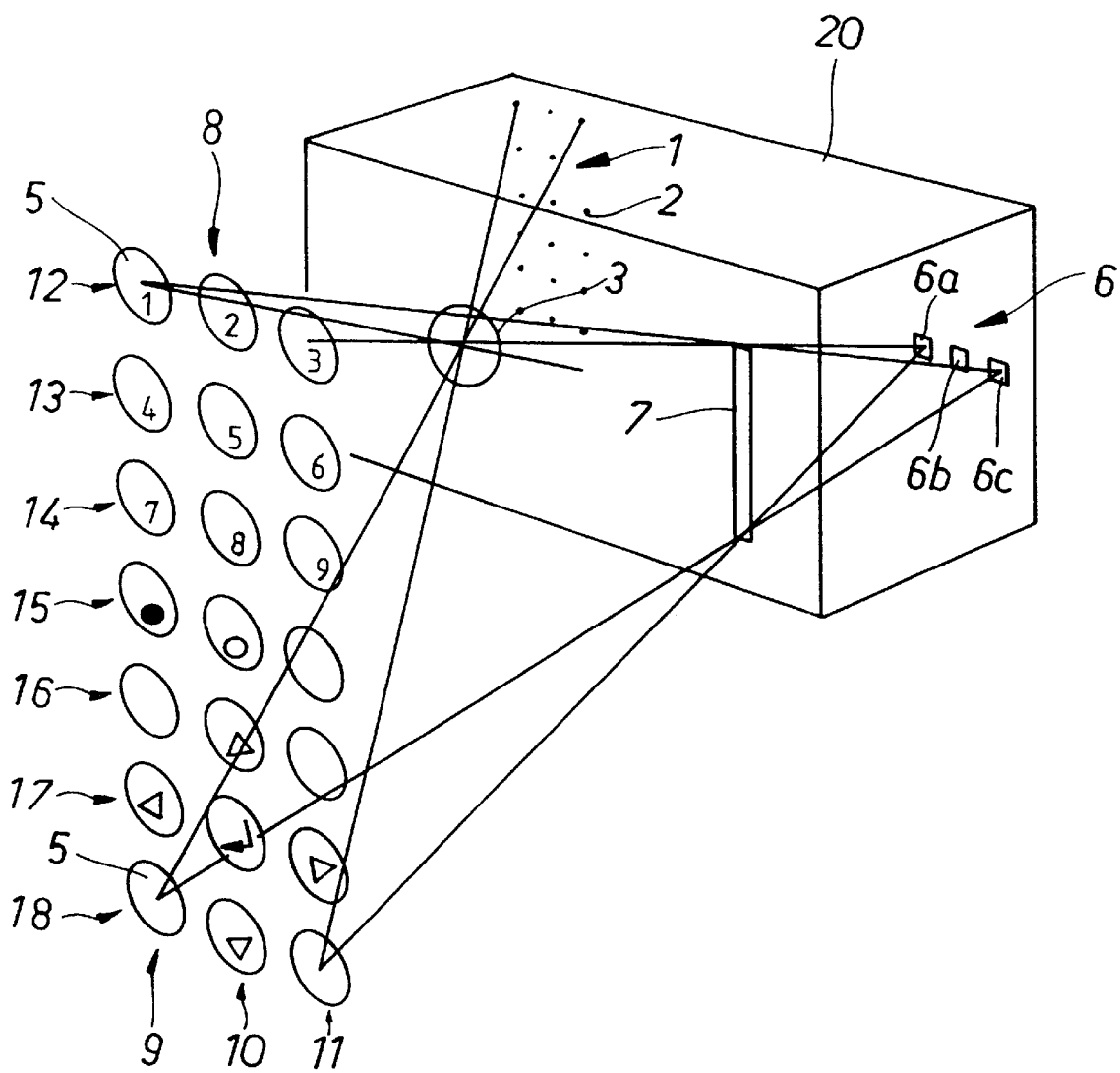
Figure 3:
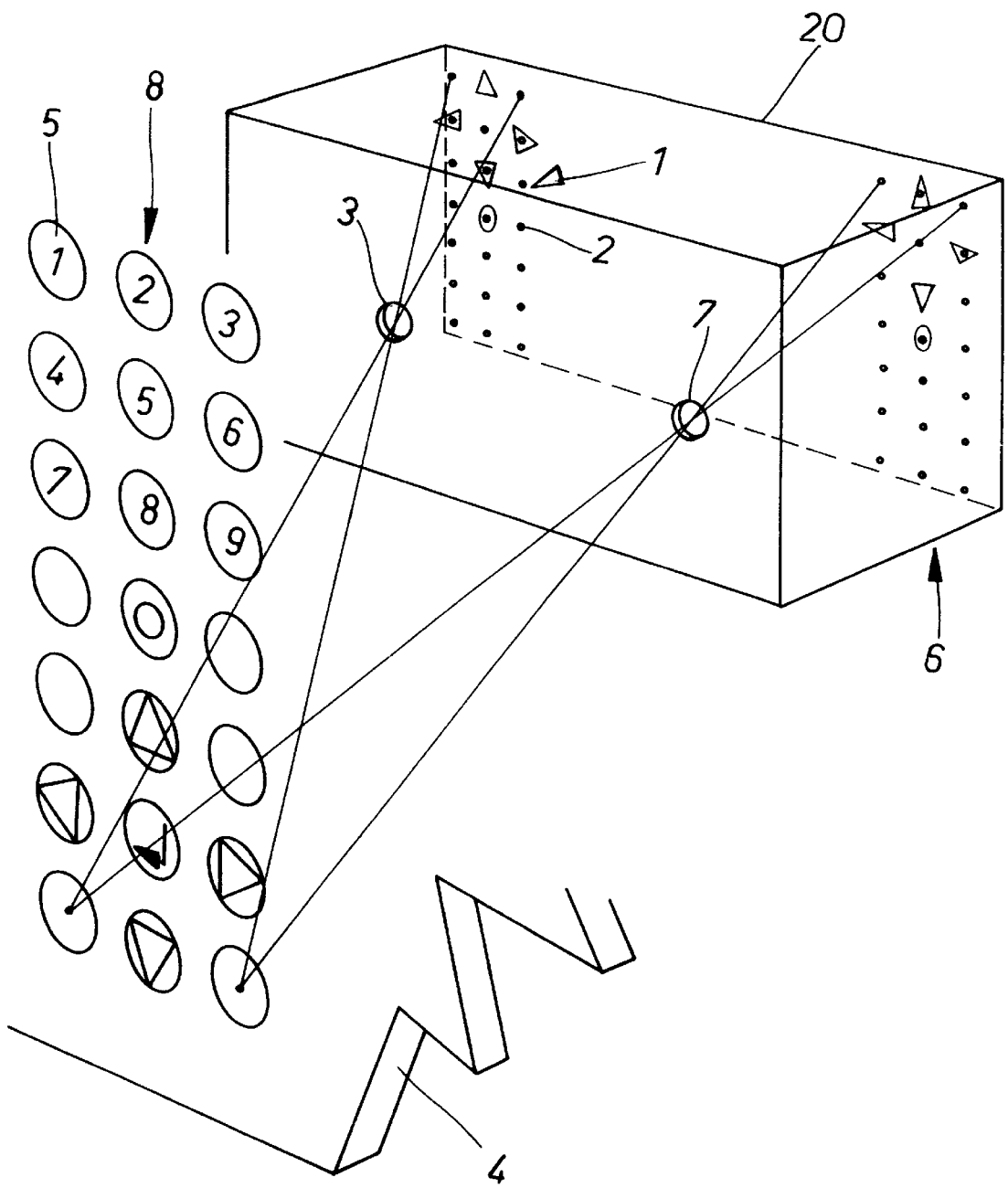

In what follows the invention is described making references to the accompanying drawings, in which:

FIG. 1 shows diagrammatically the principle of an arrangement according to the invention FIGS. 2 to 4 show diagrammatically different alternatives for the practical realization of an arrangement according to the invention.

In accordance with FIG. 1, an arrangement according to the invention comprises a transmitter part 1, from which light is transmitted through a collector member 3 to the presumed keyboard 4, and a receiver part 6 to which the light coming from the keyboard 4 is directed through the collector member 7. Light coming from the transmitter part 1 reflects onto the receiver 6 only when a finger or a palm or similar controlling member has been placed on a certain key in the pattern of keys on the keyboard. The presumed keyboard 4 can be located on the outer surface of a single or multilayered pane of glass but any other material through which light can penetrate could also be used. In principle, the presumed keyboard 4 can be formed without any solid surface, when the key pattern could be produced by e.g. the hologram technique, In this context, presumed keyboard and presumed keys mean that the keyboard has been formed optically, for example on the outer surface of glass, by transmitting the image of a source of light onto the desired position on the keyboard, the pattern of which has been marked on the relevant surface with an adhesive label or similar, so that the user knows which position to press with a finger to produce the desired dialling pattern.

In the embodiment shown in FIG. 2 the transmitter part 1 is formed by several light sources 2, which could, for example, be LEDs operating in the infrared radiation zone. Light transmitted by the LEDs 2 travels through the collector member 3 onto the presumed keyboard 4, the key pattern 8 of which has been marked by attaching an appropriate adhesive label on the outer surface of the window pane or similar surface. The key pattern 8 contains the required number of keys 5 arranged advantageously into a matrix which, in the shown embodiment, contains three vertical rows 9–11 and seven horizontal rows 12–18. The key pattern 8 can, for example, have number keys running in one direction and arrow keys in another. A lens or a hole in a board, for example, can be used as the collecting member 3 The board in question could advantageously be the front wall of the case 20 which, advantageously, contains both the transmitter part 1 and the receiver part 6. Each key 5 of the key pattern 8 connects with its own LED 2, so that the light transmitted by the LED 2 in question reflects in respect of the key connected with it through a second collecting member 7 to the receiver part 6 only when the key in question is pressed with a finger or a similar controlling member. An elongated gap or cylindrical lens act advantageously as the second collecting member 7. The receiver part 6 contains advantageously a separate receiver 6a–6c for each vertical row 9–11 of the key pattern 8. The operation of the LEDs 2 has been timed for example so that each LED is on separately, one at a time, so that when a given receiver 6a–6c detects light, the processor connected with the arrangement indicates whether any of the light sources 2 belonging to the same row are lit at the same time, thereby providing information on whether it was a 'correct' identification or an error message. For the recognition of a LED, the processor uses information connected with the moment of time the different LEDs are on and the moment of time the light coming to the receiver 6a–6c is received. The LEDs 2 can also be arranged to come on as groups, for example, a vertical row at a time, so that when the receiver detects light from a particular row, the processor identifies the LED in question for example so that the LEDs of the row in question are arranged to come on one at a time, and the processor can determine which LED is on at the moment the light is detected. The recognition of the LEDs can also be realized so that after the reception of the light in the receiver the LEDs are lit up one horizontal row at a time.

FIG. 3 shows a similar arrangement to FIG. 2, in which essentially round holes in the front panel of the case 20 act as the collecting members 3 and 7. Furthermore, in this embodiment each light transmitter 2 corresponds with its own receiver, which receivers have been advantageously connected with each other in vertical rows.

FIG. 4 show one other embodiment, in which the transmitter part 1 and the receiver part 6 have been placed inside the case 20 so that the light coming from the transmitter part 1 reflects via a concave mirror 3 onto the presumed keyboard so that when a finger is placed on a certain key, the light continues to reflect via the concave mirror 7 to the receiver 6.

In accordance with the Figures, the rays of light coming from the transmitter part 1 travel diagonally in relation to the presumed keyboard 4, whereas the rays of light going from the keyboard 4 to the receiver 6 travel at essentially right-angles to the keyboard. This transmission of light in a direction which differs from the direction it is received makes the locating of the presumed keyboard in the desired position (at the desired distance from the case 20) relatively easy. Furthermore, it produces the illusion that the glass or corresponding surface upon which the keyboard is located is, in itself, touch sensitive, i.e., to dial the desired series, the user must press a finger clearly against the surface which contains the keyboard.

What is claimed is:

1. An arrangement for the optical remote control of apparatus, comprising:
    a light transmitter part (1), in which there are several sources of light (2), a first collector member (3), through which the light from each of the sources of light (2) of the transmitter part (1) travels,
    a keyboard (4), in which a keyboard layout is arranged, wherein when each key (5) in the keyboard layout is connected to at least one source of light (2) in the transmitter part (1), the image of which source of light (2) is visible at the location of the relevant key (5), a light receiver part (6), a second collector member (7), through which the light coming from the keyboard travels to the processor of the receiver part (6), which controls the operation of the light transmitter part (1), each source of light (2) being timed to light up in turn so that when an appendage of an operator is at the position of a key (5), the light coming from the source of light (2) is reflected from it through the second collector member (7) to the receiver part (6), when the processor recognizes the moment when at least one source of light (2) is on and, on the basis of the data relating to the moment of reception of the light arriving at the receiver (6), recognizes which key is in operation.

2. An arrangement according to claim 1, characterized in that the key-board layout comprises a matrix of vertical (9, 10, 11) and horizontal rows (12–18), in which a receiver (6*a*, 6*b*, 6*c*) is dedicated to each vertical row (9–11), so that when light corresponding to a certain vertical row (9–11) is observed by a receiver (6*a*–6*c*), the processor states whether one of the sources of light (2) belonging to that row has lit up at the same moment, so that it is known whether this is a 'correct' identification or an error message.

3. An arrangement according to claim 1 wherein the sources of light are LED's transmitting infrared radiation, and wherein the receiver (6*a*–6*c*) is an infrared-sensitive detector.

4. An arrangement according to claim 1 wherein the first collector member (3) comprises an aperture, and wherein the second collector member (7) comprises an elongated aperture.

5. An arrangement according to claim 1 wherein the transmitter part (1), the first collector member (3), the second collector member (7) and the receiver part (6) are located in a common case (20), which is located at a distance from the keyboard (4).

6. An arrangement according to claim 1 wherein the keyboard (4) is arranged on the outer face of a transparent surface forming a wall of a housing, and wherein the transmitter part and the receiver part are located inside said housing at a distance from an inner face of the transparent surface.

7. An arrangement according to claim 1, wherein the transmitter part (1) is located in such a way that the rays of light coming from the sources of light (2) travel at an angle to the keyboard (4), and that the receiver part (6) is in turn so located as to receive rays of light coming from the keyboard (4) at essentially right-angles.

8. An arrangement according to claim 1 wherein the first collector member (3) comprises a lens and wherein the second collector member (7) comprises an elongated cylindrical lens.

9. An arrangement for the optical remote control of an apparatus comprising:

a light transmitter comprising a plurality of sources of light;

a virtual keyboard comprising a plurality of virtual keys, wherein the light from each of said sources of light travels to a respective one of said plurality of virtual keys and wherein the image of said source of light is visible at the location of the relevant virtual key;

a light receiver; and, a processor connected to said light receiver for monitoring and controlling the operation of the light transmitter, wherein each source of light is timed to light up in turn so that when the appendage of the operator is at the position of the virtual key, the light coming from the source of light is reflected from it to the receiver, wherein the processor recognizes the moment when the various sources of light are on and, on the basis of the moment of reception of the light arriving at the receiver, recognizes which key is in operation.

10. The arrangement of claim 9 wherein said keyboard layout comprises a matrix of vertical and horizontal rows in which a receiver is dedicated to each vertical row so that when light corresponding to a certain vertical row is observed by the receiver, the processor states whether one of the sources of light belonging to that row has lit up at the same moment so that it is known whether this is a correct identification or an error message.

11. The arrangement of claim 9 wherein said sources of light transmit infrared radiation and wherein said receiver is an infrared sensitive detector.

12. The arrangement of claim 9 further comprising:

a first collector member through which the light from each of said several sources of light travels; and a second collector member through which the light coming from the virtual keyboard travels to the processor of the receiver.

13. The arrangement of claim 12 wherein said first collector member comprises a lens and said second collector member also comprises a lens.

14. The arrangement of claim 12 wherein said first collector member comprises an aperture and said second collector member comprises an elongated gap.

15. The arrangement of claim 12 further comprising a housing for accommodating said transmitter part, said first collector member, said second collector member and said receiver, wherein said transmitter and said receiver are located at a distance from said virtual keyboard.

16. The arrangement of claim 15 wherein said virtual keyboard is located on an outer surface of a transparent member forming a wall of said housing and wherein said transmitter and said receiver are located within said housing and spaced from said transparent member.

17. The arrangement of claim 16 wherein said transparent member comprises a window of said housing.

* * * * *